United States Patent
Modi et al.

(10) Patent No.: US 9,876,478 B2
(45) Date of Patent: Jan. 23, 2018

(54) APPARATUS AND METHODS FOR WIDE LOCAL AREA NETWORK POWER AMPLIFIERS

(71) Applicant: Skyworks Solutions, Inc., Woburn, MA (US)

(72) Inventors: Hardik Bhupendra Modi, Irvine, CA (US); Craig Joseph Christmas, San Diego, CA (US); Xuanang Zhu, Lexington, MA (US); Mark M. Doherty, Westford, MA (US)

(73) Assignee: Skyworks Solutions, Inc., Woburn, MA (US)

( * ) Notice: Subject to any disclaimer, the term of this patent is extended or adjusted under 35 U.S.C. 154(b) by 40 days.

(21) Appl. No.: 14/493,928

(22) Filed: Sep. 23, 2014

(65) Prior Publication Data

US 2015/0009980 A1   Jan. 8, 2015

Related U.S. Application Data

(63) Continuation-in-part of application No. 13/666,627, filed on Nov. 1, 2012, now Pat. No. 9,083,282.
(Continued)

(51) Int. Cl.
  *H03F 3/04*   (2006.01)
  *H03G 3/30*   (2006.01)
  (Continued)

(52) U.S. Cl.
  CPC ......... *H03G 3/3042* (2013.01); *H03F 1/0222* (2013.01); *H03F 1/565* (2013.01);
  (Continued)

(58) Field of Classification Search
  CPC ........................................................ H03F 3/04
  (Continued)

(56) References Cited

U.S. PATENT DOCUMENTS 5,300,895 A   4/1994 Jones
5,347,229 A   9/1994 Suckling
(Continued)

FOREIGN PATENT DOCUMENTS

CN   1702959 A   11/2005
CN   1914791 A   2/2007
(Continued)

OTHER PUBLICATIONS

Kim et al. 'Envelope Tracking Technique for Multimode PA Operation', In: Proceedings of the 39th European Microwave Conference, Sep. 29-Oct. 1, 2009, pp. 429-432.
(Continued)

*Primary Examiner* — Patricia T Nguyen
(74) *Attorney, Agent, or Firm* — Knobbe, Martens, Olson & Bear, LLP

(57) ABSTRACT

Apparatus and methods for wireless local area network (WLAN) power amplifiers are provided. In certain configurations, a WLAN power amplifier system includes a WLAN power amplifier, an output impedance matching network, and an envelope tracker. The WLAN power amplifier includes an input that receives a WLAN signal having a fundamental frequency and an output that generates an amplified WLAN signal for transmission over an antenna. The output impedance matching network is electrically connected to the output of the WLAN power amplifier, and can provide a load line impedance between 10Ω and 35Ω at the fundamental frequency. The envelope tracker receives an envelope of the WLAN signal, and controls a voltage level of a power supply of the WLAN power amplifier based on the envelope signal.

20 Claims, 11 Drawing Sheets

Related U.S. Application Data

(60) Provisional application No. 61/555,754, filed on Nov. 4, 2011.

(51) Int. Cl.
  *H03F 1/02* (2006.01)
  *H03F 1/56* (2006.01)
  *H03F 3/19* (2006.01)
  *H04B 1/04* (2006.01)
  *H03F 3/24* (2006.01)

(52) U.S. Cl.
  CPC ............. *H03F 3/19* (2013.01); *H03F 3/245* (2013.01); *H04B 1/0458* (2013.01); *H03F 2200/102* (2013.01); *H03F 2200/105* (2013.01); *H03F 2200/108* (2013.01); *H03F 2200/387* (2013.01)

(58) Field of Classification Search
  USPC .............................. 330/302, 297, 296, 310
  See application file for complete search history.

(56) References Cited

U.S. PATENT DOCUMENTS

| | | | |
|---|---|---|---|
| 5,748,042 A | 5/1998 | Norris et al. | |
| 6,140,892 A | 10/2000 | Uda et al. | |
| 6,384,688 B1 | 5/2002 | Fujioka et al. | |
| 6,577,199 B2 | 6/2003 | Dent | |
| 6,750,546 B1 | 6/2004 | Villanueva et al. | |
| 7,202,736 B1 | 4/2007 | Dow et al. | |
| 7,265,618 B1 | 9/2007 | Meck | |
| 7,372,334 B2 | 5/2008 | Blair et al. | |
| 7,643,800 B2 | 1/2010 | Rofougaran | |
| 7,728,696 B2 | 6/2010 | Stuebing et al. | |
| 7,733,118 B2 | 6/2010 | Hollis et al. | |
| 7,733,187 B2 | 6/2010 | Tateoka et al. | |
| 7,848,286 B2 | 12/2010 | Zhen et al. | |
| 7,852,281 B2 | 12/2010 | Choudhury | |
| 7,872,523 B2 | 1/2011 | Sivakumar et al. | |
| 7,899,006 B2 | 3/2011 | Boyd | |
| 7,928,804 B2 | 4/2011 | Yamamoto et al. | |
| 8,081,928 B2 | 12/2011 | Kelly | |
| 8,164,387 B1 | 4/2012 | Apel et al. | |
| 8,274,162 B2 | 9/2012 | Monthei | |
| 8,301,106 B2 | 10/2012 | Misra | |
| 8,611,834 B2 | 12/2013 | Harris et al. | |
| 8,797,103 B2 | 8/2014 | Kaczman et al. | |
| 8,983,406 B2 | 3/2015 | Zhang et al. | |
| 9,041,472 B2 | 5/2015 | Chen et al. | |
| 9,083,282 B2 | 7/2015 | Zhang et al. | |
| 9,231,533 B2 | 1/2016 | Zhang et al. | |
| 9,294,056 B2 | 3/2016 | Nobbe et al. | |
| 9,374,045 B2 | 6/2016 | Zhang et al. | |
| 9,392,409 B2 | 7/2016 | Moir et al. | |
| 9,467,940 B2 | 10/2016 | Zhang et al. | |
| 9,509,251 B2 * | 11/2016 | Jones ................. | H01L 23/5227 |
| 2002/0171477 A1 * | 11/2002 | Nakayama ............ | H03F 1/3223 330/53 |
| 2003/0085761 A1 | 5/2003 | Okubo et al. | |
| 2005/0104679 A1 | 5/2005 | Blednov | |
| 2005/0122164 A1 | 6/2005 | Brandt et al. | |
| 2006/0181351 A1 | 8/2006 | Ripley | |
| 2007/0024374 A1 | 2/2007 | Blair et al. | |
| 2007/0057731 A1 | 3/2007 | Le | |
| 2007/0085754 A1 | 4/2007 | Ella et al. | |
| 2008/0039025 A1 | 2/2008 | Ray et al. | |
| 2009/0278610 A1 | 11/2009 | Murji et al. | |
| 2010/0060357 A1 | 3/2010 | Drogi et al. | |
| 2010/0164632 A1 * | 7/2010 | Blednov ............... | H03F 1/0222 330/310 |
| 2010/0253435 A1 | 10/2010 | Ichitsubo et al. | |
| 2010/0291888 A1 | 11/2010 | Hadjichristos et al. | |
| 2011/0018632 A1 | 1/2011 | Pletcher et al. | |
| 2011/0133838 A1 | 6/2011 | Paul et al. | |
| 2011/0140772 A1 | 6/2011 | Sengupta et al. | |
| 2011/0195677 A1 | 8/2011 | Misra | |
| 2012/0087282 A1 | 4/2012 | Shibahara | |
| 2012/0154054 A1 * | 6/2012 | Kaczman ............... | H03F 1/083 330/295 |
| 2013/0029619 A1 | 1/2013 | Zhang et al. | |
| 2013/0084816 A1 | 4/2013 | Gomez et al. | |
| 2013/0116017 A1 | 5/2013 | Zhang et al. | |
| 2013/0130752 A1 | 5/2013 | Zhang et al. | |
| 2013/0223565 A1 * | 8/2013 | McCallister ...... | H04L 25/03343 375/297 |
| 2013/0265107 A1 | 10/2013 | Holmes | |
| 2015/0009980 A1 | 1/2015 | Modi et al. | |
| 2015/0171799 A1 | 6/2015 | Zhang et al. | |
| 2015/0207578 A1 | 7/2015 | Ramamurthy et al. | |
| 2015/0295548 A1 | 10/2015 | Zhang et al. | |
| 2016/0079940 A1 | 3/2016 | Zhang et al. | |

FOREIGN PATENT DOCUMENTS

| | | |
|---|---|---|
| CN | 101505178 A | 8/2009 |
| CN | 101981810 A | 2/2011 |
| CN | 102217138 A | 10/2011 |
| CN | 103988424 A | 8/2014 |
| CN | 104011998 A | 8/2014 |
| GB | 2510084 | 7/2014 |
| WO | WO 2010-134858 A1 | 11/2010 |
| WO | WO 2011-001769 | 1/2011 |
| WO | WO 2011-010769 | 1/2011 |
| WO | WO 2013/009640 | 1/2013 |
| WO | WO 2013/067031 | 5/2013 |
| WO | WO 2013/071152 | 5/2013 |

OTHER PUBLICATIONS

Kang et al. 'A Highly Linear and Efficient Differential CMOS Power Amplifier With Harmonic Control', In: IEEE Journal of Solid-State Circuits, Vol. 41, No. 6, June 2006, pp. 1314-1322.
Woo et al. 'Analysis and Experiments for High-Efficiency Class-F and Inverse Class-F Power Amplifiers', In: IEEE Transactions on Microwave Theory and Techniques, Vol. 54, No. 5, May 2006, pp. 1969-1974.
Spirito, M., et al., "Experimental Procedure to Optimize Out-of-Band Terminations for Highly Linear and Power Efficient Bipolar Class-AB RF Amplifiers", IEEE BCTM 7.3, 2005, pp. 112-115.
Collinson, Glenn, et al., "Effects of Harmonic Terminations on Power and Efficiency of GAAS HBT Power Amplifiers at 900MHZ", IEE Colloquium on Solid-State Power Amplifiers, Dec. 16, 1991, pp. 12/1-12/5.
International Preliminary Report on Patentability of May 6, 2014 for International Patent Application No. PCT/US2012/062828, filed Oct. 31, 2012. 6 pages.
Search Report and Written Opinion of Mar. 11, 2013 for International Application No. PCT/US2012/062828, 10 pages.
Ali et al, "Efficiency Enhancement of a Tunable RF Power Amplifier by Second Harmonic Manipulation using Thin-Film BST Varactor," Proceedings of Asia-Pacific Microwave Conference, 2010, pp. 434-436.
Bischof et al, "SiGe-Power Amplifiers in Flipchip and Packaged Technology," IEEE Radio Frequency Circuits Symposium, 2001, pp. 35-38.
Tombak et al, "A Flip-Chip Silicon IPMOS Power Amplifier and a DC/DC Converter for GSM 850/900/1800/1900 MHz Systems," IEEE Radio Frequency Circuits Symposium, 2007, pp. 79-82.
Xu, "1-8-GHz GaN-Based Power Amplifier Using Flip-Chip Bonding," IEEE Microwave and Guided Wave Letters, Jul. 1999, pp. 277-279, vol. 9, No. 7.
B.K. et al., "Envelope Tracking Technique for Multimode PA Operation," In: Proceedings of the 39th European Microwave Conference, Sep. 29-Oct. 1, 2009, pp. 429-432.
J.K. et al., "A Highly Linear and Efficient Differential CMOS Power Amplifier With Harmonic Control," In: IEEE Journal of Solid-State Circuits, vol. 41, No. 6, Jun. 2006, pp. 1314-1322.

(56) References Cited

OTHER PUBLICATIONS

Y.Y.W. et al., "Analysis and Experiments for High Efficiency Class-F and Inverse Class-F Power Amplifiers," In: IEEE Transactions on Microwave Theory and Techniques, vol. 54, No. 5, May 2006, pp. 1969-1974.

IEEE Standards Association, IEEE 802.11™: Wireless LANs, http://standards.ieee.org/about/get/802/802.11.html (accessed: Jan. 5, 2017).

Cripps, Steve C., "RF Power Amplifiers for Wireless Communications," $2^{nd}$ ed., Artech House 2006.

\* cited by examiner

APPARATUS AND METHODS FOR WIDE LOCAL AREA NETWORK POWER AMPLIFIERS

CROSS-REFERENCE TO RELATED APPLICATIONS

This application is a continuation-in-part of U.S. patent application Ser. No. 13/666,627, filed Nov. 1, 2012 and titled "APPARATUS AND METHODS FOR POWER AMPLIFIERS", which claims the benefit of priority under 35 U.S.C. § 119(e) of U.S. Provisional Patent Application No. 61/555,754, filed Nov. 4, 2011 and titled "APPARATUS AND METHODS FOR POWER AMPLIFIERS", each of which are herein incorporated by reference in their entireties.

BACKGROUND

Field

Embodiments of the invention relate to electronic systems, and in particular, to power amplifiers for radio frequency (RF) electronics.

Description of the Related Technology

Power amplifiers can be included in mobile devices to amplify a RF signal for transmission via an antenna. For example, in mobile devices having a time division multiple access (TDMA) architecture, such as those found in Global System for Mobile Communications (GSM), code division multiple access (CDMA), and wideband code division multiple access (W-CDMA) systems, a power amplifier can be used to amplify a RF signal having a relatively low power. It can be important to manage the amplification of a RF signal, as a desired transmit power level can depend on how far the user is away from a base station and/or the mobile environment. Power amplifiers can also be employed to aid in regulating the power level of the RF signal over time, so as to prevent signal interference from transmission during an assigned receive time slot.

The power consumption of a power amplifier can be an important consideration. One technique for reducing power consumption of a power amplifier is envelope tracking, in which the voltage level of the power supply of the power amplifier is controlled in relation to the envelope of the RF signal. Thus, when the envelope of the RF signal increases, the voltage supplied to the power amplifier can be increased. Likewise, when the envelope of the RF signal decreases, the voltage supplied to the power amplifier can be decreased to reduce power consumption.

There is a need for improved power amplifier systems. Furthermore, there is a need for power amplifiers having improved power efficiency.

SUMMARY

In certain embodiments, the present disclosure relates to a wireless local area network (WLAN) power amplifier system. The WLAN power amplifier system includes a WLAN power amplifier including an input and an output, the input configured to receive a WLAN signal having a fundamental frequency and the output configured to generate an amplified WLAN signal. The WLAN power amplifier system further includes an output impedance matching network electrically connected to the output of the WLAN power amplifier and configured to provide a load line impedance between 10Ω and 35Ω at the fundamental frequency of the WLAN signal, and an envelope tracker configured to receive an envelope signal corresponding to an envelope of the WLAN signal, the envelope tracker configured to control a voltage level of a power supply of the WLAN power amplifier based on the envelope signal.

In some embodiments, the output impedance matching network is configured to provide a load line impedance between 18Ω and 22Ω at the fundamental frequency of the WLAN signal.

According to various embodiments, the output impedance matching network includes a fundamental matching circuit and one or more harmonic termination circuits, the fundamental matching circuit and each of the of the one or more harmonic termination circuits including separate input terminals coupled to the output of the WLAN power amplifier, the fundamental matching circuit and each of the one or more harmonic termination circuits separately tuned. In certain embodiments, the one or more harmonic termination circuits includes a second harmonic termination circuit and a third harmonic termination circuit.

In numerous embodiments, the WLAN power amplifier system further includes a choke inductor electrically connected between the output of the WLAN power amplifier and an output of the envelope tracker that controls the voltage level of the power supply of the WLAN power amplifier.

In some embodiments, the WLAN power amplifier system further includes a bias circuit configured to generate a bias current for the WLAN power amplifier, the bias circuit configured to decrease a magnitude of the bias current when a power level of the amplified WLAN signal decreases.

In accordance with various embodiments, the WLAN power amplifier includes an input stage and an output stage arranged in a cascade, the WLAN power amplifier system further includes a power detector electrically connected to an output of the input stage.

In certain embodiments, the present disclosure relates to a wireless device. The wireless device includes a transceiver configured to generate a wireless local area network (WLAN) signal and an envelope signal corresponding to an envelope of the WLAN signal, and a WLAN power amplifier including an input and an output, the input configured to receive the WLAN signal and the output configured to generate an amplified WLAN signal. The wireless device further includes an output impedance matching network electrically connected to the output of the WLAN power amplifier and configured to provide a load line impedance between 10Ω and 35Ω at a fundamental frequency of the WLAN signal, and an envelope tracker configured to receive the envelope signal and to control a voltage level of a power supply of the WLAN power amplifier based on the envelope signal.

In some embodiments, the output impedance matching network is configured to provide a load line impedance between 18Ω and 22Ω at the fundamental frequency of the WLAN signal.

According to various embodiments, the output impedance matching network includes a fundamental matching circuit and one or more harmonic termination circuits, the fundamental matching circuit and each of the of the one or more harmonic termination circuits including separate input terminals coupled to the output of the WLAN power amplifier, the fundamental matching circuit and each of the one or more harmonic termination circuits separately tuned. In certain embodiments, the one or more harmonic termination circuits includes a second harmonic termination circuit and a third harmonic termination circuit.

In numerous embodiments, the wireless device further includes a choke inductor electrically connected between the output of the WLAN power amplifier and an output of the envelope tracker that controls the voltage level of the power supply of the WLAN power amplifier.

In some embodiments, the wireless device further includes a bias circuit configured to generate a bias current for the WLAN power amplifier, the bias circuit configured to decrease a magnitude of the bias current when a power level of the amplified WLAN signal decreases.

In accordance with various embodiments, the transceiver includes an envelope shaping circuit configured to receive an amplitude signal and to generate a digital shaped signal, and a digital-to-analog converter (DAC) configured to receive the digital shaped signal and to generate the envelope signal.

In some embodiments, the WLAN power amplifier includes an input stage and an output stage arranged in a cascade, the WLAN power amplifier system further includes a power detector electrically connected to an output of the input stage. According to a number of embodiments, the transceiver includes a WLAN processor and an analog-to-digital converter (ADC), the ADC configured to receive an analog power detection signal from the power detector and to provide a digital power detection signal to the WLAN processor.

In certain embodiments, the present disclosure relates to a method of wireless local area network (WLAN) amplification. The method includes generating a WLAN signal and an envelope signal using a transceiver, the envelope signal corresponding to an envelope of the WLAN signal. The method further includes amplifying the WLAN signal using a WLAN power amplifier, the WLAN power amplifier including an input that receives the WLAN signal and an output that generates an amplified WLAN signal. The method further includes providing impedance matching to the output of the WLAN power amplifier using an output impedance matching network, the output impedance matching network providing a load line impedance between 10Ω and 35Ω at a fundamental frequency of the WLAN signal. The method further includes generating a power supply voltage for the WLAN power amplifier using an envelope tracker, and controlling a voltage level of the power supply voltage based on the envelope signal using the envelope tracker.

In various embodiments, the method further includes generating a bias current for the WLAN power amplifier using a bias circuit, and controlling a magnitude of the bias current based on a power level of the amplified WLAN signal.

According to some embodiments, the WLAN power amplifier includes an input stage and an output stage arranged in a cascade, and the method further includes measuring an output power of the input stage using a power detector.

In a number of embodiments, the method further includes providing impedance matching to the output of the WLAN power amplifier further includes providing a load line impedance between 18Ω and 22Ω at the fundamental frequency of the WLAN signal.

DETAILED DESCRIPTION OF EMBODIMENTS

The headings provided herein, if any, are for convenience only and do not necessarily affect the scope or meaning of the claimed invention.

Overview of Power Amplifier Systems

Figure 1:
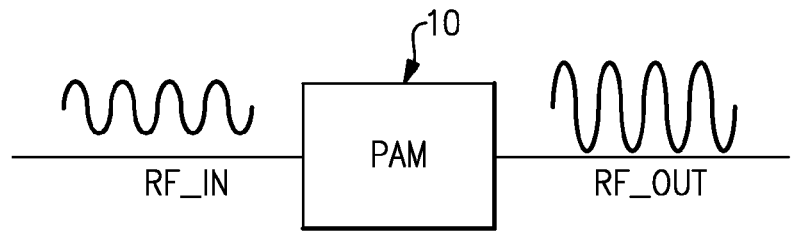
FIG. 1 is a schematic diagram of a power amplifier module for amplifying a radio frequency (RF) signal.

FIG. 1 is a schematic diagram of a power amplifier module 10 for amplifying a radio frequency (RF) signal. The illustrated power amplifier module 10 can be configured to amplify an RF signal RF_IN to generate an amplified RF signal RF_OUT. As described herein, the power amplifier module 10 can include one or more power amplifiers.

Figure 2:
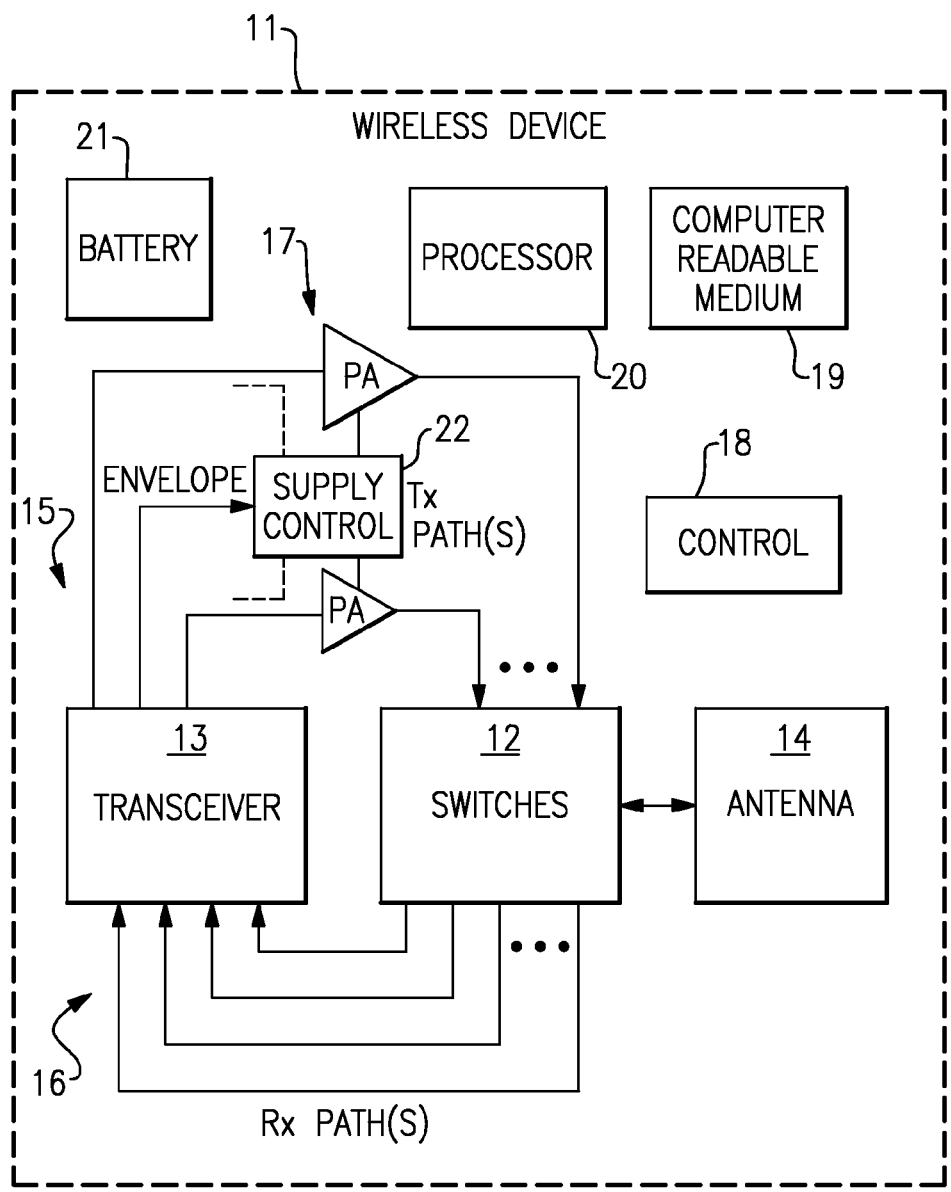
FIG. 2 is a schematic diagram of an example wireless device that can include one or more of the power amplifier modules of FIG. 1.

FIG. 2 is a schematic diagram of an example wireless device 11 that can include one or more of the power amplifier modules 10 of FIG. 1. The wireless device 11 can implement one or more features of the present disclosure.

The example wireless device 11 depicted in FIG. 2 can represent a multi-band and/or multi-mode device such as a multi-band/multi-mode mobile phone. By way of examples, Global System for Mobile (GSM) communication standard is a mode of digital cellular communication that is utilized in many parts of the world. GSM mode mobile phones can operate at one or more of four frequency bands: 850 MHz (approximately 824-849 MHz for Tx, 869-894 MHz for Rx), 900 MHz (approximately 880-915 MHz for Tx, 925-960 MHz for Rx), 1800 MHz (approximately 1710-1785 MHz for Tx, 1805-1880 MHz for Rx), and 1900 MHz (approximately 1850-1910 MHz for Tx, 1930-1990 MHz for Rx). Variations and/or regional/national implementations of the GSM bands are also utilized in different parts of the world.

Code division multiple access (CDMA) is another standard that can be implemented in mobile phone devices. In certain implementations, CDMA devices can operate in one or more of 800 MHz, 900 MHz, 1800 MHz and 1900 MHz bands, while certain W-CDMA and Long Term Evolution (LTE) devices can operate over, for example, about 22 radio frequency spectrum bands.

One or more features of the present disclosure can be implemented in the foregoing example modes and/or bands, and in other communication standards. For example, 3G, 4G, LTE, and Advanced LTE are non-limiting examples of such standards.

In certain embodiments, the wireless device 11 can include switches 12, a transceiver 13, an antenna 14, power amplifiers 17, a control component 18, a computer readable medium 19, a processor 20, a battery 21, and a supply control block 22.

The transceiver 13 can generate RF signals for transmission via the antenna 14. Furthermore, the transceiver 13 can receive incoming RF signals from the antenna 14.

It will be understood that various functionalities associated with the transmission and receiving of RF signals can be achieved by one or more components that are collectively represented in FIG. 2 as the transceiver 13. For example, a single component can be configured to provide both transmitting and receiving functionalities. In another example, transmitting and receiving functionalities can be provided by separate components.

Similarly, it will be understood that various antenna functionalities associated with the transmission and receiving of RF signals can be achieved by one or more components that are collectively represented in FIG. 2 as the antenna 14. For example, a single antenna can be configured to provide both transmitting and receiving functionalities. In another example, transmitting and receiving functionalities can be provided by separate antennas. In yet another example, different bands associated with the wireless device 11 can be provided with different antennas.

In FIG. 2, one or more output signals from the transceiver 13 are depicted as being provided to the antenna 14 via one or more transmission paths 15. In the example shown, different transmission paths 15 can represent output paths associated with different bands and/or different power outputs. For instance, the two example power amplifiers 17 shown can represent amplifications associated with different power output configurations (e.g., low power output and high power output), and/or amplifications associated with different bands. Although FIG. 2 illustrates the wireless device 11 as including two transmission paths 15, the wireless device 11 can be adapted to include more or fewer transmission paths 15.

In FIG. 2, one or more detected signals from the antenna 14 are depicted as being provided to the transceiver 13 via one or more receiving paths 16. In the example shown, different receiving paths 16 can represent paths associated with different bands. For example, the four example paths 16 shown can represent quad-band capability that some wireless devices are provided with. Although FIG. 2 illustrates the wireless device 11 as including four receiving paths 16, the wireless device 11 can be adapted to include more or fewer receiving paths 16.

To facilitate switching between receive and transmit paths, the switches 12 can be configured to electrically connect the antenna 14 to a selected transmit or receive path. Thus, the switches 12 can provide a number of switching functionalities associated with operation of the wireless device 11. In certain embodiments, the switches 12 can include a number of switches configured to provide functionalities associated with, for example, switching between different bands, switching between different power modes, switching between transmission and receiving modes, or some combination thereof. The switches 12 can also be configured to provide additional functionality, including filtering and/or duplexing of signals.

FIG. 2 shows that in certain embodiments, a control component 18 can be provided for controlling various control functionalities associated with operations of the switches 12, the power amplifiers 17, the supply control block 22, and/or other operating components.

In certain embodiments, a processor 20 can be configured to facilitate implementation of various processes described herein. For the purpose of description, embodiments of the present disclosure may also be described with reference to flowchart illustrations and/or diagrams of methods, apparatus (systems) and computer program products. It will be understood that each block of the flowchart illustrations and/or diagrams, and combinations of blocks in the flowchart illustrations and/or diagrams, may be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the acts specified in the flowchart and/or diagram block or blocks.

In certain embodiments, these computer program instructions may also be stored in a computer-readable memory 19 that can direct a computer or other programmable data processing apparatus to operate in a particular manner, such that the instructions stored in the computer-readable memory produce an article of manufacture including instruction means which implement the acts specified in the flowchart and/or diagram block or blocks. The computer program instructions may also be loaded onto a computer or other programmable data processing apparatus to cause a series of operations to be performed on the computer or other programmable apparatus to produce a computer implemented process such that the instructions that execute on the computer or other programmable apparatus provide steps for implementing the acts specified in the flowchart and/or diagram block or blocks.

The illustrated wireless device 11 also includes the supply control block 22, which can be used to provide a power supply voltage to one or more of the power amplifiers 17. For example, the supply control block 22 can include an envelope tracker configured to control or vary the voltage level of the supply voltage provided to the power amplifiers 17 based upon an envelope of the RF signal to be amplified. However, in certain implementations the supply control block 22 can include different components.

The supply control block 22 can be electrically connected to the battery 21, and the supply control block 22 can be configured to generate the supply voltage for the power amplifiers 17. The battery 21 can be any suitable battery for use in the wireless device 11, including, for example, a lithium-ion battery. As will be described in detail further below, by varying the voltage provided to the power amplifiers, the power consumed from the battery 21 can be reduced, thereby improving performance of the battery life of the wireless device 11. In certain implementations, the supply control block 22 can control the power amplifier supply voltage based on an envelope of the RF signal to be amplified. The envelope signal can be provided to the supply control block 22 from the transceiver 13. However, the envelope can be determined in other ways. For example, the envelope can be determined by detecting the envelope from the RF signal using any suitable envelope detector.

Figure 3:
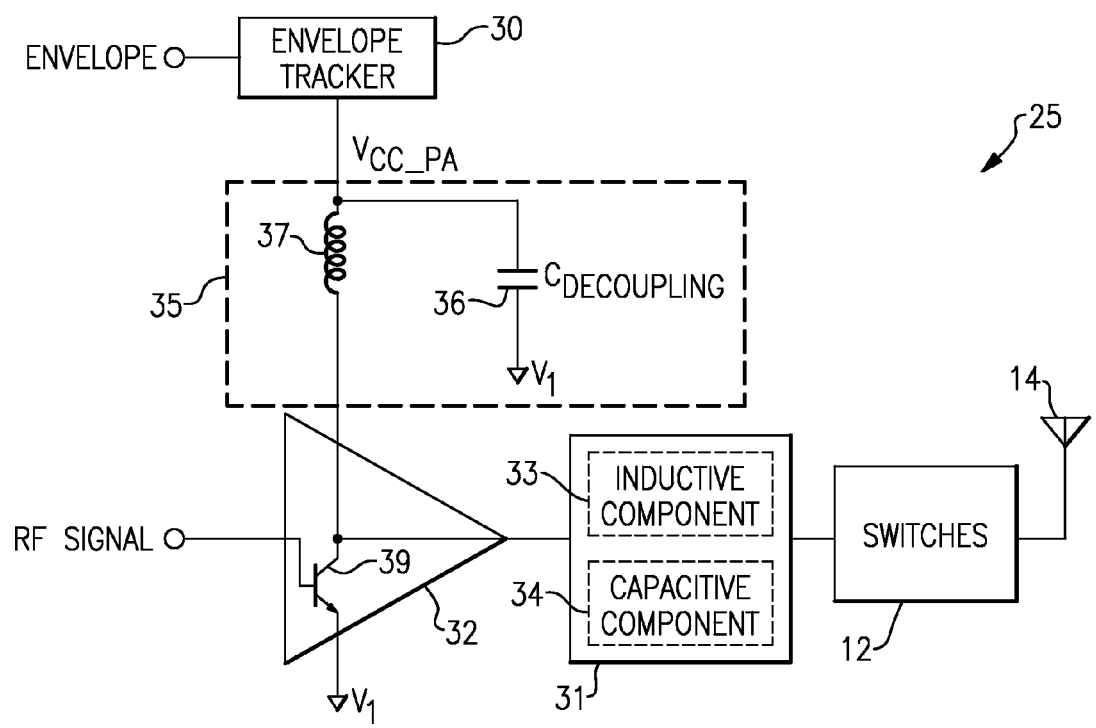
FIG. 3 is a schematic diagram of one example of a power amplifier system including an envelope tracker.

FIG. 3 is a schematic diagram of one example of a power amplifier system 25 including an envelope tracker 30. The illustrated power amplifier system 25 includes the switches 12, the antenna 14, the envelope tracker 30, an impedance matching network 31, a power amplifier 32, and a bias network 35. The impedance matching network 31 includes an inductive circuit component 33 and a capacitive circuit component 34, and the bias network 35 includes a decoupling or bypass capacitor 36 and an inductor 37.

The illustrated envelope tracker 30 is configured to receive an envelope of the RF signal and to generate a power amplifier supply voltage $V_{CC\_PA}$ for the power amplifier 32 that changes in relation to the envelope signal over time. In some implementations the power amplifier supply voltage $V_{CC\_PA}$ can have a minimum voltage in the range of about 0.5 V to about 0.7 V, and a maximum voltage in the range of about 5 V to about 5.5 V. Thus, in contrast to a conventional power amplifier system that can have a fixed voltage of, for example, about 3.4 V, the power amplifier system 25 can have a power amplifier supply voltage $V_{CC\_PA}$ that dynamically changes in relation to the envelope of the RF signal.

The illustrated power amplifier 32 includes a bipolar transistor 39 having an emitter, a base, and a collector. The emitter of the bipolar transistor 39 can be electrically connected to a first supply voltage $V_1$, which can be, for example, a ground node. Additionally, a radio frequency (RF) signal can be provided to the base of the bipolar transistor 39 such that the bipolar transistor 39 amplifies the RF signal and provides the amplified RF signal at the collector. The bipolar transistor 39 can be any suitable device. In one implementation, the bipolar transistor 39 is a heterojunction bipolar transistor (HBT).

The power amplifier 32 can be configured to provide the amplified RF signal to the switches 12. The impedance matching network 31 can be used to terminate the electrical connection between the power amplifier 32 and the switches 12. For example, the impedance matching network 31 can be used to increase power transfer and/or reduce reflections of the amplified RF signal generated using the power amplifier 32. The impedance matching network 31 includes the inductive component 33 and the capacitive component 34, which can be configured to achieve a desired impedance characteristic versus frequency.

The bias network 35 can be included to aid in biasing the power amplifier 32 with the power amplifier supply voltage $V_{CC\_PA}$ generated by the envelope tracker 30. The inductor 37 can include a first end electrically connected to the envelope tracker 30 and a second end electrically connected to the collector of the bipolar transistor 39. The inductor 37 can be used to provide the power amplifier supply voltage $V_{CC\_PA}$ to the power amplifier 32 while choking or blocking high frequency RF signal components. The decoupling capacitor 36 includes a first end electrically connected to the first end of the inductor 37 and a second end electrically coupled to the first supply voltage $V_1$. The decoupling capacitor 36 can provide a low impedance path to high frequency signals, thereby reducing the noise of the power amplifier supply voltage $V_{CC\_PA}$, improving power amplifier stability, and/or improving the performance of the inductor 37 as a RF choke. In certain implementations described herein, the decoupling capacitor 36 can be configured to have a relatively small capacitance relative to a conventional power amplifier decoupling capacitor.

Although FIG. 3 illustrates one implementation of the power amplifier 32, skilled artisans will appreciate that the teachings described herein can be applied to a variety of power amplifier structures, such as multi-stage power amplifier structures and power amplifiers employing other transistor structures. For example, in some implementations the bipolar transistor 39 can be omitted in favor of employing a field-effect transistor (FET), such as a silicon FET, a gallium arsenide (GaAs) high electron mobility transistor (HEMT), or a laterally diffused metal oxide semiconductor (LDMOS) transistor.

Figure 4A:
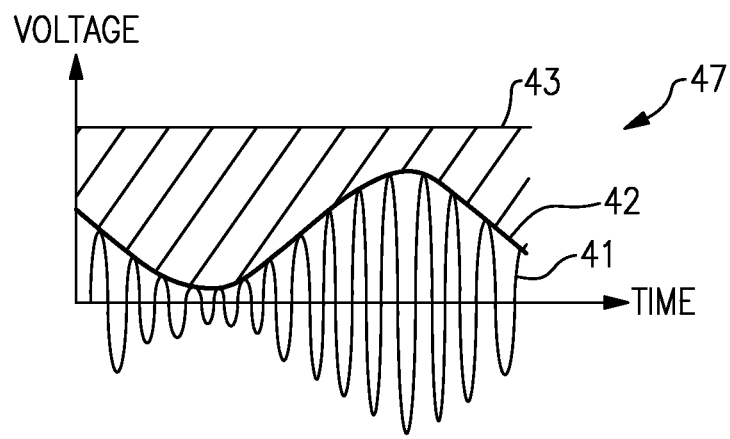
FIGS. 4A and 4B show two examples of power supply voltage versus time.
Figure 4B:
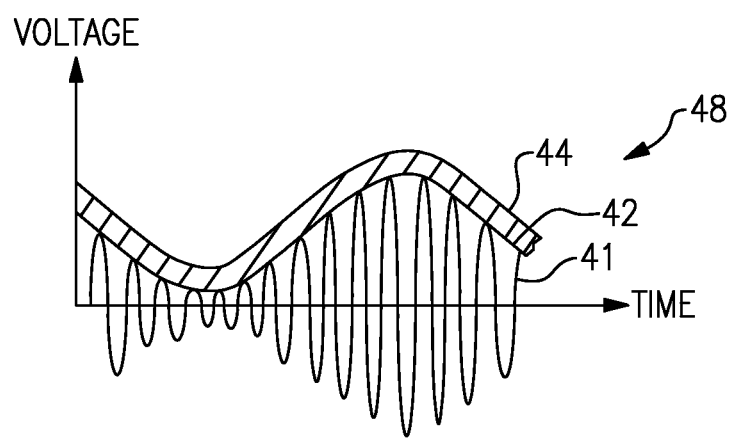

FIGS. 4A and 4B show two examples of power supply voltage versus time.

In FIG. 4A, a graph 47 illustrates the voltage of an RF signal 41 and a power amplifier supply voltage 43 versus time. The RF signal 41 has an envelope 42.

It can be important that the power supply voltage 43 of a power amplifier has a voltage greater than that of the RF signal 41. For example, providing a power supply voltage to a power amplifier having a magnitude less than that of the RF signal 41 can clip the RF signal, thereby creating signal distortion and/or other problems. Thus, it can be important the power supply voltage 43 be greater than that of the envelope 42. However, it can be desirable to reduce a difference in voltage between the power amplifier supply voltage 43 and the envelope 42 of the RF signal 41, as the area between the power amplifier supply voltage 43 and the envelope 42 can represent lost energy, which can reduce battery life and increase heat generated in a mobile device.

In FIG. 4B, a graph 48 illustrates the voltage of an RF signal 41 and a power amplifier supply voltage 44 versus time. In contrast to the power amplifier supply voltage 43 of FIG. 4A, the power amplifier supply voltage 44 of FIG. 4B varies in relation to the envelope 42 of the RF signal 41. The area between the power amplifier supply voltage 44 and the envelope 42 in FIG. 4B is less than the area between the power amplifier supply voltage 43 and the envelope 42 in FIG. 4A, and thus the graph 48 of FIG. 4B can be associated with a power amplifier system having greater energy efficiency.

Figure 5:
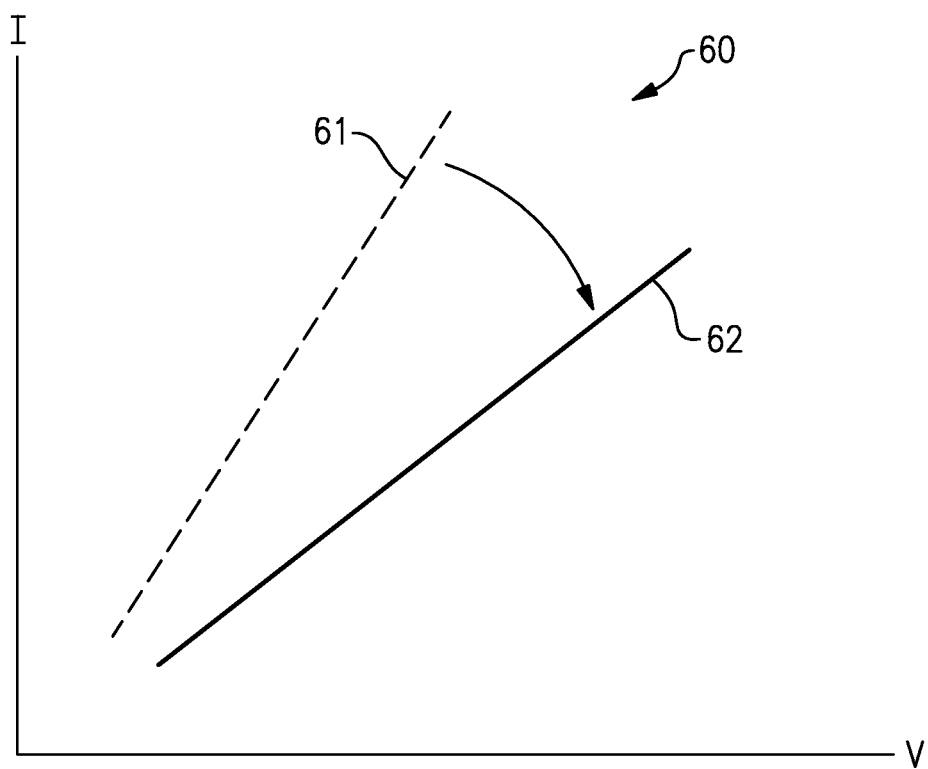
FIG. 5 shows two examples of load line current versus voltage.

FIG. 5 shows two examples of load line current versus voltage. The graph 60 can represent a current versus voltage relationship of an impedance matching network at a given frequency, such as a fundamental frequency of an amplified RF signal generated by a power amplifier.

Power added efficiency (PAE) is one metric for rating a power amplifier, and can correspond to the ratio of the difference between the output and input signal power to the DC power consumed by the power amplifier. Linearity is another metric for rating a power amplifier, and can be rated in a variety of ways including, for example, by measuring adjacent channel power ratio (ACPR) and/or by determining an input signal power level that causes a small-signal gain of the power amplifier to drop by about 1 dB. PAE and/or linearity can be metrics by which customers determine which power amplifiers to purchase, as PAE can impact battery life of an electronic device and linearity can impact signal quality of the electronic device. Although high PAE and high linearity are desirable, improving PAE can come at the cost of reducing linearity, while increasing linearity can cause a decrease in PAE.

A load line electrically connected to an output of a power amplifier can impact PAE and linearity of the power amplifier. For example, increasing the impedance of the load line can increase the PAE of the power amplifier and reduce the linearity of the power amplifier, while decreasing the impedance of the load line can increase the linearity of the power amplifier and reduce the PAE of the power amplifier.

The graph 60 includes a first plot 61 of load line current versus voltage and a second plot 62 of load line current versus voltage. As shown in FIG. 5, the first plot 61 has a relatively sharper or steeper slope than the second plot 62, and thus the first plot 61 is associated with an impedance matching network having lower load line impedance than an impedance matching network associated with the second plot 62. For example, the first plot 61 can be associated with a load line impedance of about 4Ω, while the second plot 62 can be associated with a load line impedance of about 8Ω. The first plot 61 also has a higher current for a given voltage than the second plot 61, and thus the first plot 61 can be associated with a power amplifier having a lower PAE than a power amplifier associated with the second plot 62.

In certain implementations described herein, a power amplifier system includes an impedance matching network tuned to have a relatively high load line impedance at a fundamental frequency of an RF signal amplified by the power amplifier system relative to that of a conventional power amplifier system. For example, in some implementations the impedance matching network is configured to have a load impedance at the fundamental frequency that is in the range of about 6Ω to about 10Ω, for example, about 8Ω. By increasing the load line impedance of the power amplifier, the current draw of the power amplifier can be reduced, thereby by improving power efficiency.

Although increasing the load line impedance of the power amplifier can reduce linearity of the power amplifier, the power amplifier system can be configured to meet or exceed a linearity rating by including an envelope tracker for controlling a supply voltage of the power amplifier. For example, the envelope tracker can not only improve power efficiency by controlling supply voltage in relation to an envelope signal as was described above with reference to FIG. 4B, but the envelope tracker can also improve the linearity of the power amplifier system by controlling the voltage of the power amplifier output in relation to the envelope signal. For instance, since the envelope tracker changes the DC voltage of the power amplifier output based on a low frequency component of the RF signal, the envelope tracker can improve the linearity of the power amplifier by changing the voltage of the power amplifier output at the envelope frequency.

Figure 6:
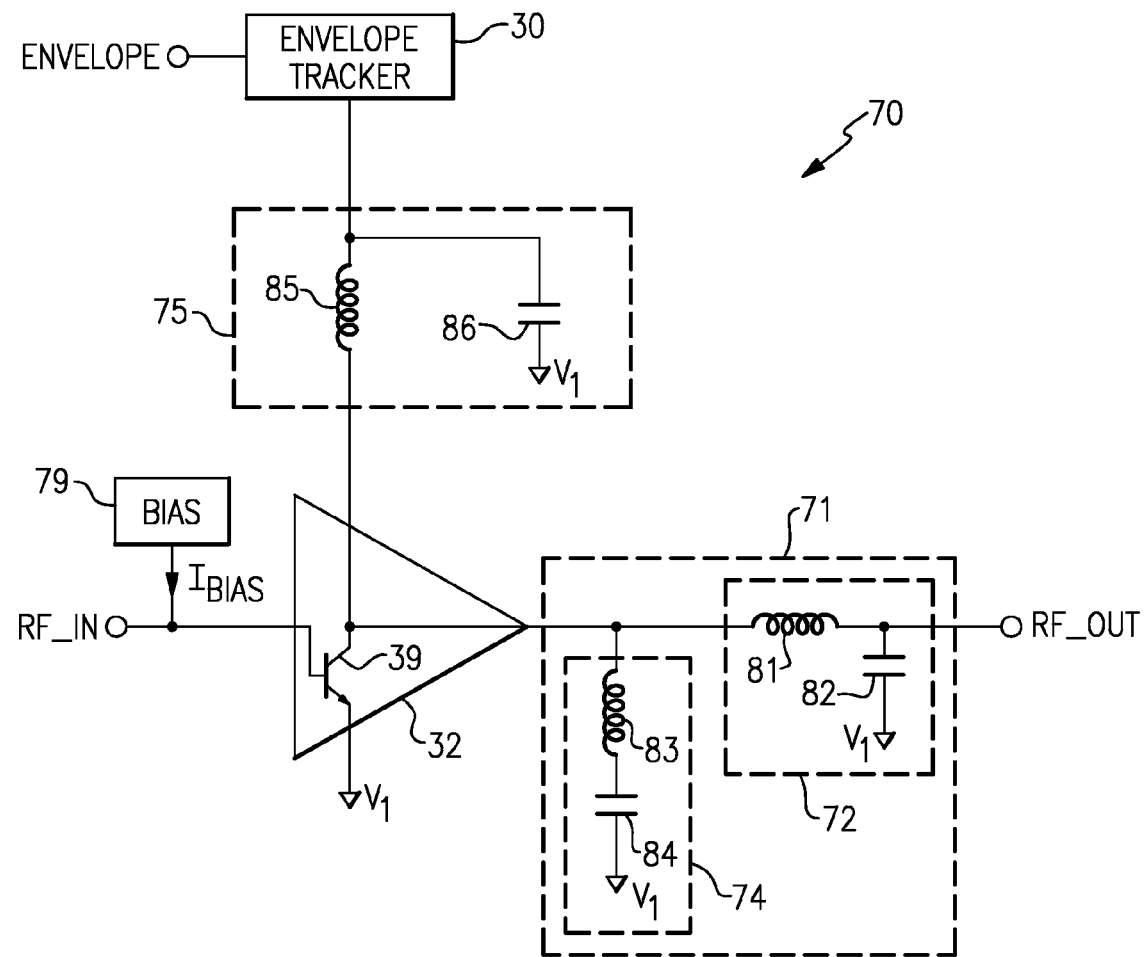
FIG. 6 is a schematic diagram of another example of a power amplifier system including an envelope tracker.

FIG. 6 is a schematic diagram of another example of a power amplifier system 70 including an envelope tracker 30. The illustrated power amplifier system 70 includes the envelope tracker 30, the power amplifier 32, an impedance matching network 71, a bias network 75, and a power amplifier input bias circuit 79. The impedance matching network 71 includes a fundamental matching circuit 72 and a second harmonic termination circuit 74. The envelope tracker 30 is configured to receive an envelope of the RF signal and to generate a power amplifier supply voltage $V_{CC\_PA}$ for the power amplifier 32. The power amplifier 32 is configured to receive a RF signal on the input terminal RF_IN and to generate an amplified RF signal on the output terminal RF_OUT.

The illustrated power amplifier 32 includes a bipolar transistor 39 having an emitter, a base, and a collector. The emitter of the bipolar transistor 39 can be electrically connected to a first supply voltage $V_1$, which can be, for example, a ground node. Additionally, the base of the bipolar transistor 39 is electrically connected to the input terminal RF_IN, which can be used to provide a RF signal to the power amplifier 32. Additionally, the base of the bipolar transistor 39 is configured to receive a bias current $I_{BIAS}$ from the power amplifier input bias circuit 79. The output of the power amplifier 32 is electrically connected to the output terminal RF_OUT through the impedance matching network 71. For example, the collector of the bipolar transistor 39 is electrically connected to the second harmonic termination circuit 74 and to the fundamental matching circuit 72. The bipolar transistor 39 can be used to amplify a RF signal received on the input terminal RF_IN and to generate an amplified version of the RF signal on the output terminal RF_OUT. Although the power amplifier 32 is illustrated as including the bipolar transistor 39, in some implementations the bipolar transistor 39 can be omitted in favor of using a field-effect transistor (FET).

The impedance matching network 71 can be used to aid in terminating the electrical connection between the power amplifier 32 and the output terminal RF_OUT. The impedance matching network 71 can be configured to have relatively high load line impedance at the fundamental frequency relative to conventional power amplifier systems. For example, in certain implementations, the impedance matching network 71 can be configured to have an impedance at the RF signal's fundamental frequency that is in the range of about 6Ω to about 10Ω, for example, about 8Ω.

The fundamental matching circuit 72 includes a first inductor 81 and a first capacitor 82, which can be used to control the load line impedance of the power amplifier 32. For example, the first inductor 81 and the first capacitor 82 can have values selected to achieve a desired load line impedance of the power amplifier 32 at the fundamental frequency. The fundamental matching circuit 72 can be used to provide an impedance transformation so as to provide a desired load impedance for the power amplifier 32 when an antenna or other load is electrically connected to the output terminal RF_OUT.

The second harmonic termination circuit 74 includes a second inductor 83 and a second capacitor 84. The second harmonic termination circuit 74 can be tuned to provide a desired impedance at about twice the fundamental frequency of the RF signal amplified by the power amplifier 32. For example, the second inductor 83 and the second capacitor 84 can be configured to have a relatively low impedance, such as an impedance of less than about 0.5Ω at about twice the fundamental frequency so as to substantially eliminate second-order harmonic signal components from the amplified RF signal generated on the output terminal RF_OUT.

Although FIG. 6 illustrates an implementation in which the impedance matching network 71 includes the fundamental matching circuit 72 and the second harmonic termination circuit 74, the teachings herein are applicable to other configurations of the impedance matching network 71. For example, in some implementations the impedance matching network 71 includes a plurality of harmonic termination circuits, such as harmonic termination circuits for second order, third order, and/or fourth or higher order terms.

As will be described in detail further below with reference to FIG. 8, in one embodiment separate connections are provided between the power amplifier 32 and the fundamental matching circuit 72 and between the power amplifier 32 and each of the harmonic termination circuits. By splitting the load line of the power amplifier 32 in this manner, the overall power efficiency of the power amplifier 32 can be increased by allowing the fundamental matching circuit 72 and each of the harmonic termination circuits to be separately tuned.

The bias network 75 can be included to bias the power amplifier 32 with the power amplifier supply voltage $V_{CC\_PA}$ generated by the envelope tracker 30. The bias network 75 includes a choke inductor 85 and a bypass capacitor 86. The choke inductor 85 can include a first end electrically connected to the envelope tracker 30 and a second end electrically connected to the collector of the bipolar transistor 39. The bypass capacitor 86 includes a first end electrically connected to the first end of the choke inductor 85 and a second end electrically coupled to the first supply voltage $V_1$. The bypass capacitor 86 can be configured to provide a low impedance path to high frequency signals.

Capacitive loading of the power amplifier supply voltage $V_{CC\_PA}$ can result in the envelope tracker 30 having a relatively large size and/or reduced power efficiency. However, some capacitance may be needed local to the power amplifier 32 to reduce noise, to provide stability to the power amplifier 32, and/or to effectively operate the inductor 85 as a choke.

In certain implementations, the bypass capacitor 86 is selected to have a relatively small value relatively to a bypass capacitance used in a conventional power amplifier system. For example, in one embodiment the bypass capacitor 86 is selected to have a capacitance in the range of about 50 pF to about 200 pF, for example, about 100 pF. Accordingly, in contrast to conventional power amplifier systems that can employ a bypass capacitor of a capacitance of 1 μF or more, in certain implementations described herein power amplifier systems are provided with relatively small bypass capacitors.

The power amplifier input bias circuit 79 can be used to provide a bias current to the power amplifier 32. For example, the power amplifier input bias circuit 79 can be used to generate a bias current $I_{BIAS}$ for the base of the bipolar transistor 39. Biasing the power amplifier 32 with a relatively large bias current $I_{BIAS}$ can increase the linearity of the power amplifier 32, but can also reduce the PAE of the power amplifier 32.

In certain implementations, the power amplifier input bias circuit 79 can be configured to dynamically adjust the bias current of the power amplifier 32 in relation to the output signal power level of the power amplifier 32. For example, as will be described below with reference to FIG. 9, in one embodiment the power amplifier input bias circuit 79 can be configured to decrease a magnitude of the bias current $I_{BIAS}$ when the output signal power level of the power amplifier 32 decreases.

Figure 7:
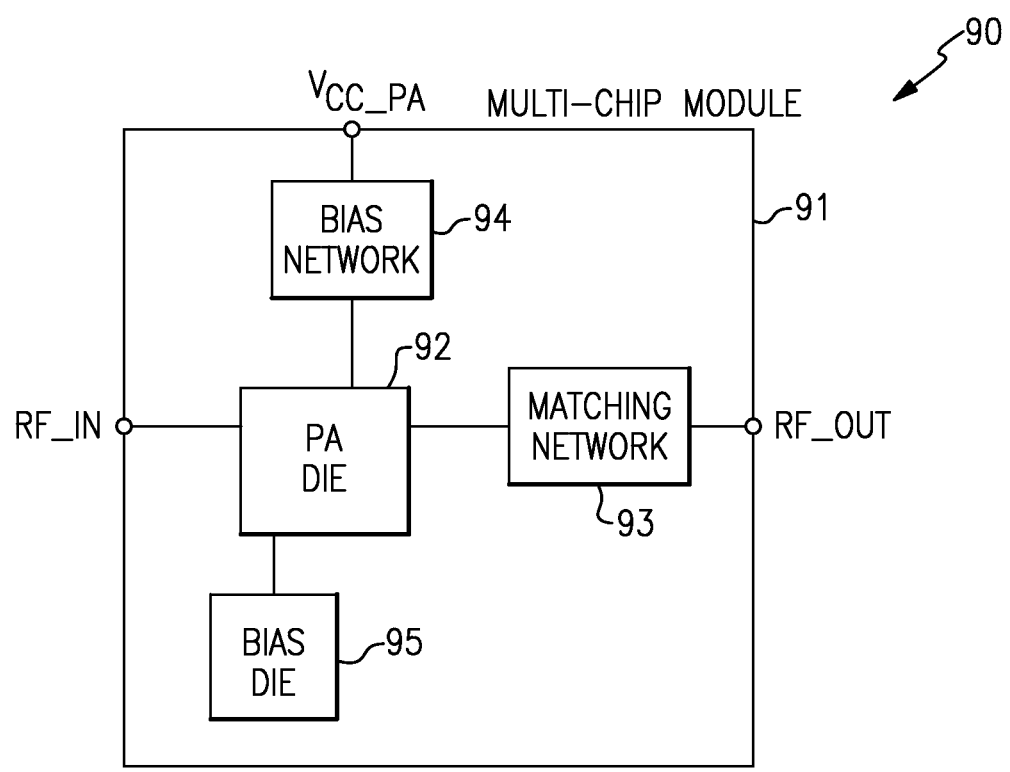
FIG. 7 is a schematic diagram of one example of a multi-chip module (MCM).

FIG. 7 is a schematic diagram of one example of a multi-chip module (MCM) 90. The illustrated MCM 90 includes a MCM substrate 91, a power amplifier die 92, an impedance matching network 93, a bias network 94, and a power amplifier bias die 95. The MCM 90 further includes a power supply pin $V_{CC\_PA}$, an input pin RF_IN, and an output pin RF_OUT. In certain implementations, the power supply pin $V_{CC\_PA}$ can be electrically connected to an envelope tracker, such as an envelope tracking module disposed on a phone board.

The power amplifier die 92 can be mounted on the MCM substrate 91, and can include one or more power amplifiers for amplifying a RF signal received on the input pin RF_IN to generate an amplified RF signal on the output pin RF_OUT. For example, the power amplifier die 92 can be a gallium arsenide (GaAs) die including heterojunction bipolar transistors (HBT).

The impedance matching network 93 can be used to aid in terminating the electrical connection between the power amplifier die 92 and the output pin RF_OUT. The impedance matching network 93 can also be configured to achieve a desired load line impedance characteristic versus frequency for the power amplifier die 92, thereby impacting the efficiency of the MCM 90. The impedance matching network 93 can include an inductive component and a capacitive component. The inductive component can be formed, for example, using trace disposed on the MCM substrate 91, using one or more bond wires, and/or using one or more surface mount components. The capacitive component can be formed, for example, using one or more surface mount components. In some implementations, the impedance matching network 93 is configured to have a load line impedance in the range of about 6Ω to about 10Ω, for example, about 8Ω.

The bias network 94 can be used to aid in biasing the power amplifier die 92 with a power supply voltage received on the power supply pin $V_{CC\_PA}$, as was described earlier. In certain implementations the bias network 94 includes an inductor formed using trace disposed on the MCM substrate 91 of the MCM 90. Although the bias network 94 can include an inductor from trace, the bias network 94 can include an inductor formed in other ways, such as by use of one or more surface mount components and/or by use of one or more bond wires. The bias network 94 can also include a capacitor for decoupling the power supply voltage from the power supply pin $V_{CC\_PA}$, such as a capacitor formed using one or more surface mount components.

The power amplifier bias die 95 can be mounted on the MCM substrate 91, and can be used, for example, to enable and disable one or more power amplifiers disposed on the power amplifier die 92 and/or to provide bias signals to the power amplifier die 92. For example, in a bipolar transistor configuration, the power amplifier bias die 95 can be used to provide a reference voltage for biasing a current mirror used to generate a base current for the power amplifiers. Accordingly, the power amplifier bias die 95 can be used to generate a bias signal for controlling a quiescent current of the power amplifier die 92.

Although FIG. 7 illustrates a configuration in which the MCM 90 includes the power supply pin $V_{CC\_PA}$ for receiving a power supply voltage from an envelope tracker, in other configurations an envelope tracking die can be mounted on the MCM substrate 91.

Figure 8:
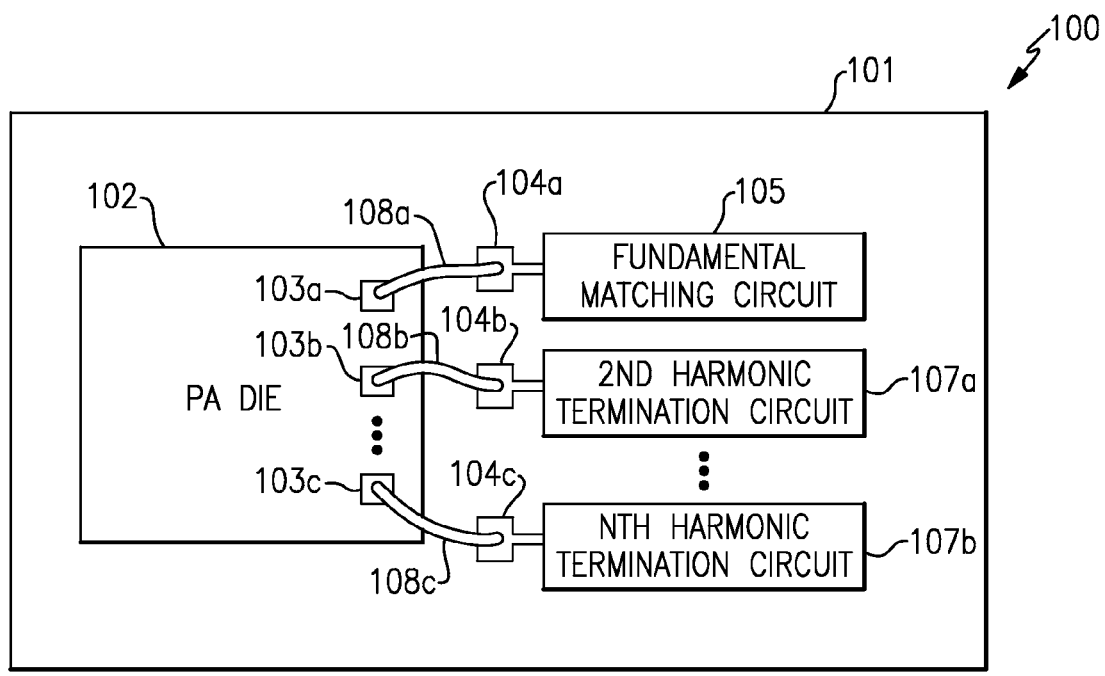
FIG. 8 is a schematic diagram of one example of a portion of a MCM.

FIG. 8 is a schematic diagram of one example of a portion of a MCM 100. The MCM 100 includes a MCM substrate 101, a power amplifier die 102, a first trace 104a, a second trace 104b, a third trace 104c, a fundamental matching circuit 105, a second harmonic termination circuit 107a, an Nth harmonic termination circuit 107b, a first bond wire 108a, a second bond wire 108b, and a third bond wire 108c. The power amplifier die 102 includes a first pad 103a, a second pad 103b, and a third pad 103c, which can be electrically connected to a common node within the power amplifier die 102. For example, in a bipolar transistor configuration, the first pad 103a, the second pad 103b, and the third pad 103c can each be electrically connected to a collector of a bipolar transistor.

The output signal of a power amplifier can include a fundamental frequency component and one or more harmonic frequency components. Some conventional power amplifier systems have included a single termination circuit to provide impedance matching at a fundamental frequency of the power amplifier output signal and to terminate one or more harmonic frequencies of the power amplifier output signal.

However, it can be difficult to tune the single termination circuit to both provide impedance matching at the fundamental frequency of the power amplifier output signal and to terminate the harmonic frequencies of the power amplifier output signal in a way that optimizes both PAE and linearity. For example, since a bond wire can have an inductance that impacts the impedance of a termination circuit, using a bond wire to connect to the single termination circuit can result in it being difficult or impossible to optimally tune the single termination circuit for fundamental and harmonic frequencies.

In the configuration illustrated in FIG. 8, the power amplifier die 102 includes separate fundamental matching and harmonic termination circuits. For example, the power amplifier die 102 includes the first pad 103a and the first bond wire 108a for electrically connecting to the first trace 104a and to the fundamental matching circuit 105, which can be configured to provide signal termination at a fundamental frequency. Additionally, the power amplifier die 102 includes the second pad 103b and the second bond wire 108b for electrically connecting to the second trace 104b and to the second harmonic termination circuit 107a, and the third pad 103c and the third bond wire 108c for electrically connecting to the third trace 104c and to the Nth harmonic termination circuit 107b.

Although the first, second and third pads 108a-108c can be electrically connected to one another and to the output of a power amplifier within the power amplifier die 102, each of the first, second and third pads 108a-108c can include separate bond wires for connecting to separate matching circuits on the MCM substrate 101. Providing separate fundamental matching and harmonic termination circuits for the power amplifier die 102 can improve the PAE and/or linearity of the power amplifier die 102 by allowing circuit elements of the fundamental matching and harmonic termination circuits to be separately tuned for optimization.

Although FIG. 8 illustrates a configuration including two harmonic termination circuits 107a, 107b, more or fewer harmonic termination circuits can be included in the MCM 100. For example, in some implementations the MCM 100 includes separate circuits for fundamental frequency matching and for second harmonic termination, while in other implementations the MCM 100 includes separate circuits for each of fundamental frequency matching, second harmonic termination and third harmonic termination.

In one embodiment, the MCM 100 includes separate harmonic termination circuits for even or odd harmonic frequencies while providing no harmonic termination for the other of the even or odd harmonic frequencies. For example, in a class F configuration, the MCM 100 can include separate circuits for fundamental frequency matching and for terminating at least one even harmonic frequency, while providing no harmonic termination for odd harmonic frequencies. Additionally, in an inverted class F configuration, the MCM 100 can include separate circuits for fundamental frequency matching and for terminating at least one odd harmonic frequency, while providing no harmonic termination for even harmonic frequencies.

Although FIG. 8 illustrates a configuration in which the fundamental matching circuit and the harmonic termination circuits are connected to separate pads of the IC, in certain implementations, the fundamental matching circuit and the harmonic termination circuits can be electrically connected to a single pin or pad of the die using different bond wires.

Figure 9:
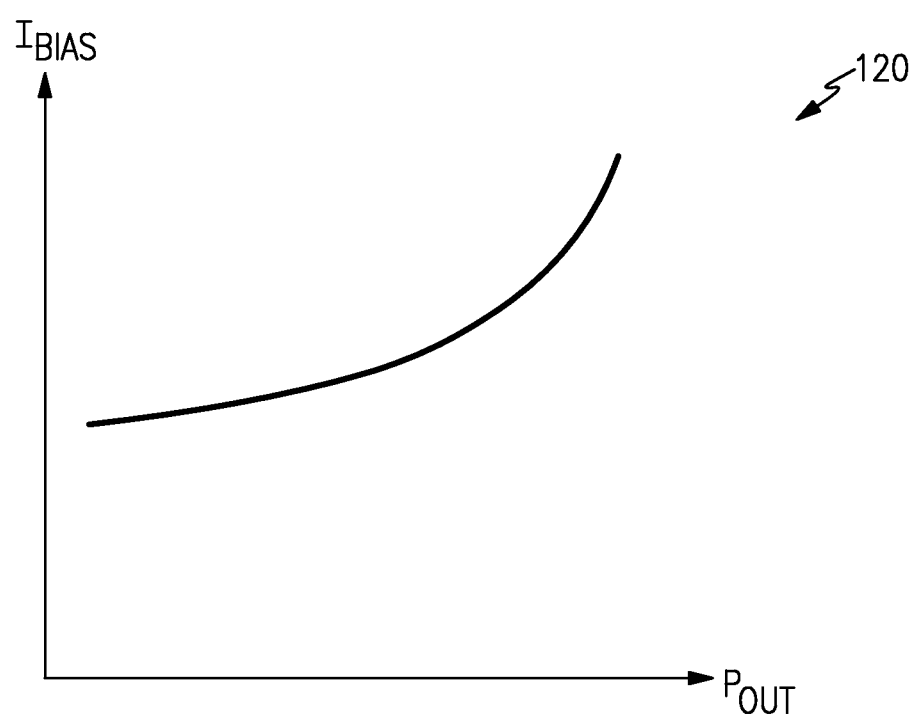
FIG. 9 shows an example of output power versus bias current for one example of a power amplifier system.

FIG. 9 shows an example of output power versus bias current for one example of a power amplifier system. The graph 120 of output power versus bias current can represent an example of the magnitude of the bias current $I_{BIAS}$ of the power amplifier input bias circuit 79 of FIG. 6 versus output power of the RF signal RF_OUT of FIG. 6.

As illustrated in the graph 120 of FIG. 9, the bias current can decrease as the output power $P_{OUT}$ decreases. In certain configurations, the linearity of a power amplifier system with an envelope tracker can increase at low output power levels. Accordingly, the bias current $I_{BIAS}$ of the power amplifier system can be decreased at low output power levels to increase power efficiency while maintaining a linearity above a threshold, such as a threshold associated with a linearity rating of the power amplifier system.

Overview of Radio Frequency Systems Including One or More WLAN Power Amplifiers

Power amplifiers can be included in radio frequency systems to amplify a wireless local area network (WLAN) signal for transmission. For example, certain wireless devices can communicate using not only cellular standards, but also using other communication standards, including, for example, a WLAN standard such as Wi-Fi or IEEE 802.11.

Apparatus and methods for WLAN power amplifiers are provided herein. In certain configurations, a WLAN power amplifier system includes a WLAN power amplifier, an output impedance matching network, and an envelope tracker. The WLAN power amplifier includes an input that receives a WLAN signal and an output that generates an amplified WLAN signal for transmission over an antenna. The output impedance matching network is electrically connected to the output of the WLAN power amplifier, and can provide a load line impedance between 10Ω and 35Ω at a fundamental frequency of the WLAN signal. The envelope tracker receives an envelope of the WLAN signal, and controls a voltage level of a power supply of the WLAN power amplifier based on the envelope signal.

The WLAN power amplifiers herein can exhibit high power added efficiency (PAE), while meeting or exceeding error vector magnitude (EVM) specifications, which can be relatively stringent relative to EVM specifications associated with long term evolution (LTE) power amplifiers. The envelope tracker can be used to compensate for a loss of linearity associated with the high load line impedance of the output impedance matching network.

Figure 10:
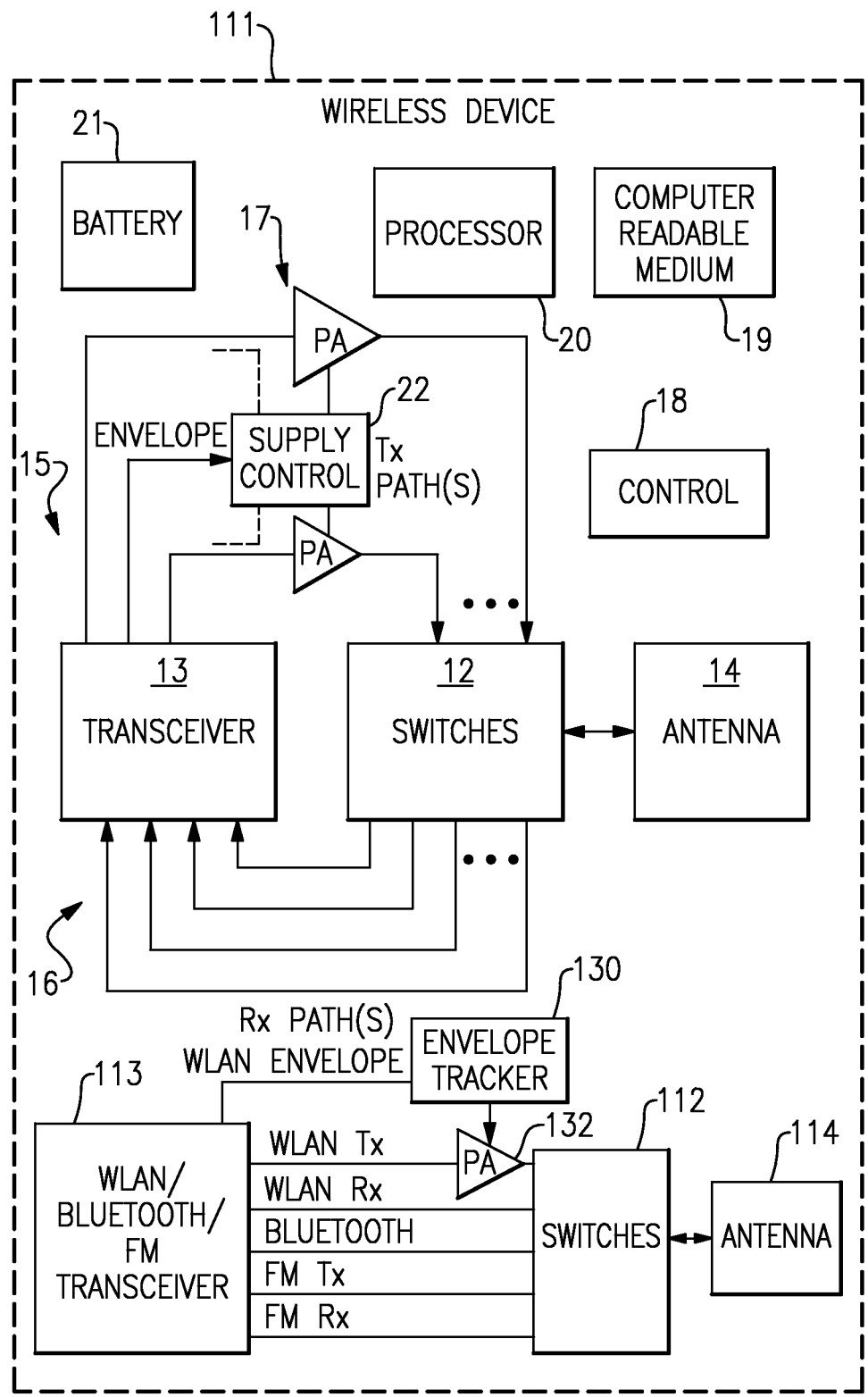
FIG. 10 is a schematic diagram of one embodiment of a wireless device that can include one or more WLAN power amplifiers.

FIG. 10 is a schematic diagram of one embodiment of a wireless device 111 that can include one or more WLAN power amplifiers. The wireless device 111 includes the switches 12, the transceiver 13, the primary antenna 14, the control component 18, the supply control module 22, the computer readable medium 19, the processor 20, and the battery 21, which can be as described earlier.

The wireless device 111 further includes switches 112, a WLAN/Bluetooth/FM transceiver 113, an antenna 114, a WLAN envelope tracker 130, and a WLAN power amplifier 132.

The switches 112 can be used to electrically connect the antenna 114 to a particular transmit or receive path associated with the WLAN/Bluetooth/FM transceiver 113, thereby allowing the antenna 114 to be used for multiple functions. Although FIG. 10 illustrates a configuration in which the antenna 114 is used to transmit and receive signals associated with WLAN, Bluetooth, and FM radio, other configurations are possible.

The illustrated WLAN/Bluetooth/FM transceiver 113 generates a WLAN transmit signal that is received by the WLAN power amplifier 132. The WLAN power amplifier 132 amplifies the WLAN transmit signal to generate an amplified WLAN signal that is provided to the switches 112. In the illustrated configuration, the WLAN/Bluetooth/FM transceiver 113 further generates a Bluetooth signal and an FM transmit signal for the switches 132, and receives a WLAN receive signal and an FM receive signal from the switches 112. However, other configurations are possible.

The envelope tracker 130 receives a WLAN envelope signal from the WLAN/Bluetooth/FM transceiver 113. The WLAN envelope signal changes in relation to the envelope of the WLAN transmit signal amplified by the WLAN power amplifier 132. The envelope tracker 130 generates a WLAN power amplifier supply voltage, and controls a voltage level of the WLAN power amplifier supply voltage in relation to the WLAN envelope signal. As shown in FIG. 10, the WLAN power amplifier supply voltage is used to power the WLAN power amplifier 132.

The wireless device 111 is operable to transmit and receive WLAN signals, such as Wi-Fi signals. For example, the wireless device 111 can be used to communicate with Wi-Fi devices, including, for instance, wearable electronics such as wireless headsets or wrist watches, and/or to communicate over the Internet using a wireless access point or hotspot.

The envelope tracker 130 has been used to control a power supply voltage of the WLAN power amplifier 132, and thus can be used to improve power added efficiency (PAE) associated with Wi-Fi communications.

Although FIG. 10 illustrates one example of a wireless device that can include one or more WLAN power amplifiers, the WLAN power amplifier systems described herein can be used in other wireless devices and electronics.

Figure 11:
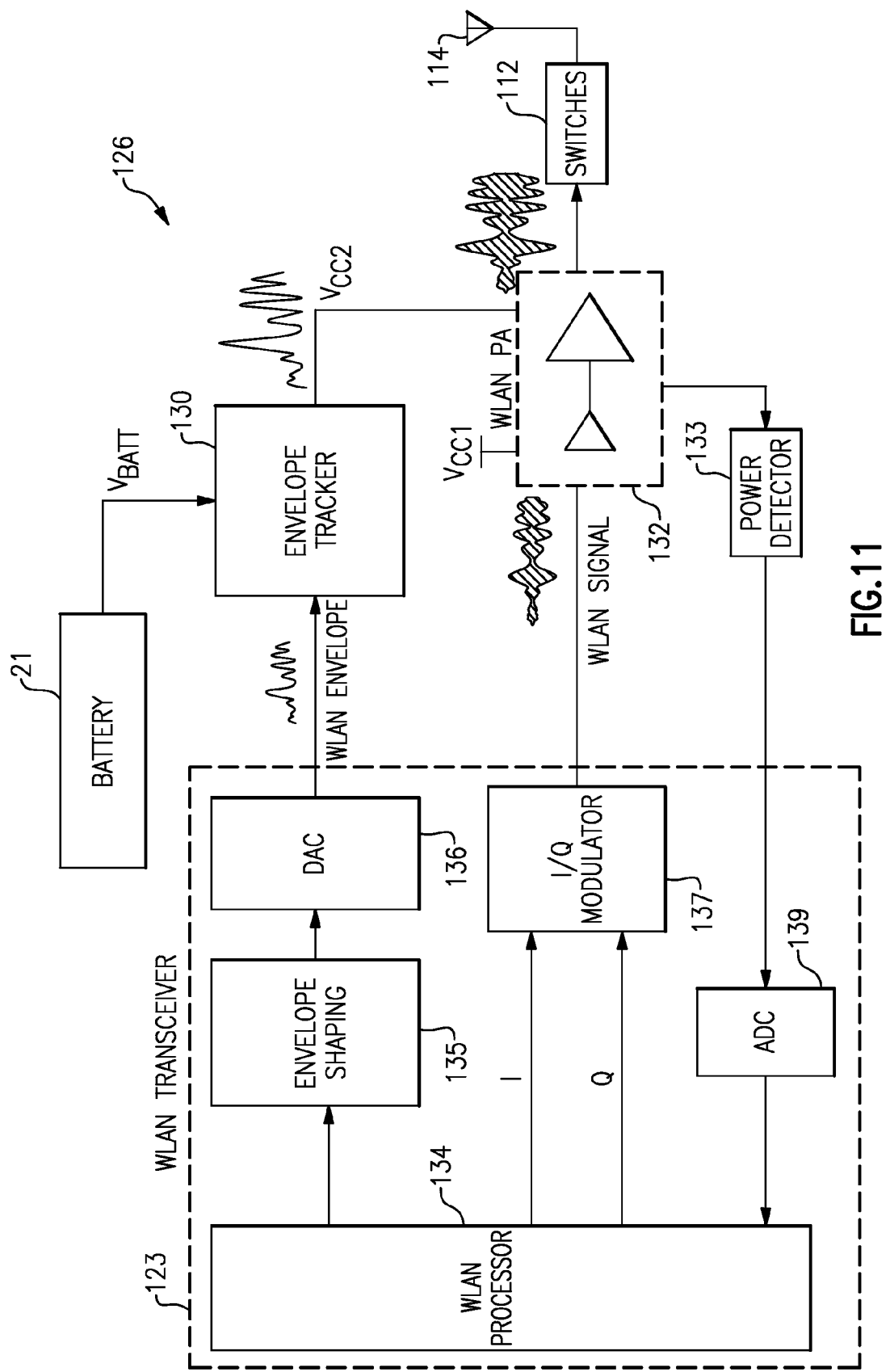
FIG. 11 is a schematic diagram of one embodiment of a WLAN power amplifier system.

FIG. 11 is a schematic diagram of one embodiment of a WLAN power amplifier system 126. The WLAN power amplifier system 126 includes the battery 21, the switches 112, the antenna 114, a WLAN transceiver 123, an envelope tracker 130, a WLAN power amplifier 132, and a power detector 133. The illustrated WLAN transceiver 123 includes a WLAN processor 134, an envelope shaping block or circuit 135, a digital-to-analog converter (DAC) 136, an I/Q modulator 137, and an analog-to-digital converter (ADC) 139. Although not illustrated in FIG. 11 for clarity, the WLAN transceiver 123 can include circuitry associated with receiving signals over one or more receive paths.

The WLAN signal processor 134 can be used to generate an I signal and a Q signal, which can be used to represent a sinusoidal wave or signal of a desired amplitude, frequency, and phase. For example, the I signal can be used to represent an in-phase component of the sinusoidal wave and the Q signal can be used to represent a quadrature component of the sinusoidal wave, which can be an equivalent representation of the sinusoidal wave. In certain implementations, the I and Q signals can be provided to the I/Q modulator 137 in a digital format. The WLAN processor 134 can be any suitable processor configured to process a WLAN signal. For instance, the WLAN processor 134 can include a digital signal processor, a microprocessor, a programmable core, or any combination thereof. Furthermore, in some implementations, the WLAN processor 134 can be configured to provide additional functionality, such as processing associated with FM signals, Bluetooth signals, and/or mobile TV signals.

The I/Q modulator 137 can be configured to receive the I and Q signals from the WLAN processor 134 and to process the I and Q signals to generate a WLAN signal. For example, the I/Q modulator 137 can include DACs configured to convert the I and Q signals into an analog format, mixers for upconverting the I and Q signals to radio frequency, and a signal combiner for combining the upconverted I and Q signals into a WLAN signal suitable for amplification by the WLAN power amplifier 132. In certain implementations, the I/Q modulator 137 can include one or more filters configured to filter frequency content of signals processed therein.

The envelope shaping block 135 and the DAC 136 can be used to convert an amplitude signal associated with the I and Q signals into a WLAN envelope signal. The envelope shaping block 135 can provide signal shaping that can enhance performance of the WLAN power amplifier system 126 relative to a configuration in which the envelope shaping block 135 is omitted. In certain implementations, the WLAN envelope shaping block 135 is a digital circuit configured to generate a digital WLAN envelope signal, and the DAC 136 is used to convert the digital WLAN envelope signal into an analog WLAN envelope signal suitable for use by the envelope tracker 130. However, other configurations are possible.

In the illustrated configuration, the WLAN power amplifier 132 receives a first power high supply voltage $V_{CC1}$ and a second power high supply voltage $V_{CC2}$. The first power high supply voltage $V_{CC1}$ can be used to power an input stage of the WLAN power amplifier 132, and the second power high supply voltage $V_{CC2}$ can be used to power an output stage of the WLAN power amplifier 132. Employing separate supply voltages for two or more stages of the WLAN power amplifier 132 can reduce power supply noise and/or capacitive loading of the envelope tracker 130. In certain implementations, the first power high supply voltage $V_{CC1}$ has a fixed voltage level. For instance, the first power high supply voltage $V_{CC1}$ can be generated using a voltage regulator (not illustrated in FIG. 11).

The envelope tracker 130 can receive the WLAN envelope signal from the WLAN transceiver 123 and a battery voltage $V_{BATT}$ from the battery 21, and can use the WLAN envelope signal to generate the second power amplifier supply voltage $V_{CC2}$ for the WLAN power amplifier 132. The envelope tracker 130 can control the voltage level of the second power amplifier supply voltage $V_{CC2}$ to change in relation to the WLAN envelope signal.

The WLAN power amplifier 132 can receive the WLAN signal from the I/Q modulator 137 of the WLAN transceiver 123, and can provide an amplified WLAN signal to the antenna 114 through the switches 112.

In certain configurations, the WLAN power amplifier 132 can include an input stage and an output stage arranged in a cascade, and the power detector 133 can measure an output power of the input stage. The detected power signal from the power detector 133 can be provided to the ADC 139, which can convert the detected power signal to a digital format suitable for processing by the WLAN processor 134.

By including a feedback path from the WLAN power amplifier 132 to the WLAN processor 134, the WLAN processor 134 can be used to dynamically adjust the I and Q signals to optimize the operation of the WLAN power amplifier system 126. For example, configuring the WLAN power amplifier system 126 in this manner can aid in controlling the power added efficiency (PAE), error vector magnitude (EVM), and/or linearity of the WLAN power amplifier 132.

The WLAN power amplifier 132 can include an output impedance matching network (not illustrated in FIG. 11). In certain configurations described herein, the output impedance matching network is tuned to have a high load line impedance at a fundamental frequency of the WLAN signal relative to that of a conventional WLAN power amplifier system. For example, in certain configurations, the output impedance matching network of the WLAN power amplifier 132 can provide a load line impedance between 10Ω and 35Ω, or more particular between 18Ω and 22Ω, at the fundamental frequency of the WLAN signal amplified by the WLAN power amplifier 132. Providing the WLAN power amplifier 132 with a high load line impedance can reduce current draw and improve power efficiency.

Although increasing the load line impedance of the WLAN power amplifier 132 can also undesirably reduce WLAN power amplifier's linearity, the illustrated WLAN power amplifier system 126 also includes the envelope tracker 130, which can increase linearity. For example, the envelope tracker 130 can not only improve power efficiency by controlling the second power high supply voltage $V_{CC2}$ in relation to the WLAN envelope signal, but the envelope tracker 130 can also improve linearity of the WLAN power amplifier 132 since the envelope tracker 130 changes a voltage level of the WLAN power amplifier's output based on a low frequency component of the WLAN signal. Thus, the envelope tracker 130 can also improve the WLAN power amplifier's linearity by changing the voltage level of the WLAN power amplifier's output at the envelope frequency.

Although FIG. 11 illustrates a particular configuration of a WLAN power amplifier system, other configurations are possible, including for example, configurations in which the WLAN transceiver 123 includes more or fewer components and/or a different arrangement of components.

Figure 12A:
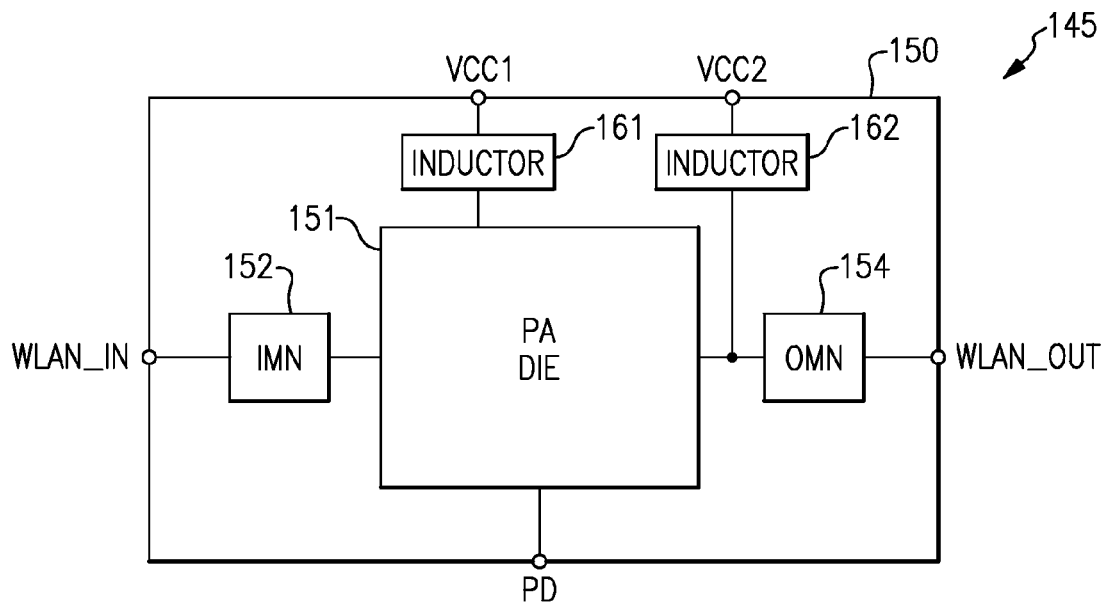
FIG. 12A is a schematic diagram of a WLAN power amplifier module according to one embodiment.

FIG. 12A is a schematic diagram of a WLAN power amplifier module 145 according to one embodiment. The WLAN power amplifier module 145 includes a substrate 150, a WLAN power amplifier die 151, an input impedance matching network 152, an output impedance matching network 154, a first inductor 161, and a second inductor 162. The WLAN power amplifier module 145 is illustrated as including a WLAN input pin WLAN_IN, a WLAN output pin WLAN_OUT, a power detector pin PD, a first power high supply pin VCC1, and a second power high supply pin VCC2.

Although not illustrated in FIG. 12A for clarity of the figures, the WLAN power amplifier module 145 can be adapted to include additional pins and circuitry.

The substrate 150 can be implemented as a multi-layer substrate configured to support dies and components and to provide electrical connectivity to external circuitry when the WLAN power amplifier module 145 is mounted on a printed circuit board (PCB), such as a phone board.

The WLAN power amplifier die 151 can receive a WLAN signal from the WLAN input pin WLAN_IN, and can generate an amplified WLAN signal on the WLAN output pin WLAN_OUT. The WLAN power amplifier die 151 can include one or more power amplifiers, including, for example, multi-stage power amplifiers configured to amplify the WLAN signal. The WLAN power amplifier die 151 can be any suitable die. In one implementation, the WLAN power amplifier die 151 is a gallium arsenide (GaAs) die having transistors fabricated thereon using a heterojunction bipolar transistor (HBT) process.

As shown in FIG. 12A, the WLAN power amplifier module 145 can receive a first power high supply voltage on the first power high supply pin VCC1 and a second power high supply voltage on the second power high supply pin VCC2. In certain configurations, the first power high supply voltage and the second power high supply voltage can be used to power an input stage and an output stage, respectively, of a WLAN power amplifier disposed on the WLAN power amplifier die 151. However, other configurations are possible, such as implementations including more or fewer power high supply pins.

The first inductor 161 and the second inductor 162 operate as choke inductors. In certain configurations, the first inductor 161 operates in an electrical path between the first power high supply pin VCC1 and an output of an input stage of a WLAN power amplifier, and the second inductor 162 operates in an electrical path between the second power high supply pin VCC2 and an output of an output stage of the WLAN power amplifier. The first and second inductors 161, 162 can be implemented, for example, using trace of the substrate 150, surface mount components, or a combination thereof.

The input impedance matching network 152 can be used to provide impedance matching between the WLAN power amplifier die 151 and the WLAN input pin WLAN_IN, and the output impedance matching network 154 can be used to provide impedance matching between the WLAN power amplifier die 151 and the WLAN output pin WLAN_OUT. Including the input and output impedance matching networks 152, 154 can increase power transfer and/or reduce reflections of the WLAN signals relative to a configuration in which the impedance matching networks are omitted.

In certain configurations, the output impedance matching network 154 can provide a load line impedance between 10Ω and 35Ω at the fundamental frequency of the WLAN signal received on the WLAN input pin WLAN_IN. Providing high load line impedance at the output of the WLAN power amplifier die 151 can reduce current draw and improve PAE. Additionally, the power high supply voltages received on the first and/or second power high supply pins VCC1, VCC2 can be generated by an envelope tracker, such as the envelope tracker 130 of FIG. 11, which can increase the WLAN power amplifier system's linearity. Powering the WLAN power amplifier module 145 using an envelope tracker can aid in compensating for a loss of linearity associated with operating the WLAN power amplifier die 151 with high load line impedance.

In certain configurations, the output impedance matching network 154 can employ a split load line. For example, with reference back to FIG. 8, the output impedance matching network 154 can include a fundamental matching circuit and one or more harmonic termination circuits. Additionally, separate connections can be provided between the WLAN power amplifier die 151 and the fundamental matching circuit and between the WLAN power amplifier die 151 and each of the harmonic termination circuits. By splitting the load line of the WLAN power amplifier die 151 in this manner, overall power efficiency can be increased by allowing the fundamental matching circuit and each of the harmonic termination circuits to be separately tuned. In one embodiment, the harmonic termination circuits include a second harmonic termination circuit and a third harmonic termination circuit.

As shown in FIG. 12A, the WLAN power amplifier die 151 provides a power detection signal to the power detector pin PD. The power detection signal can be provided to a WLAN transceiver that is located on a phone board.

Figure 12B:
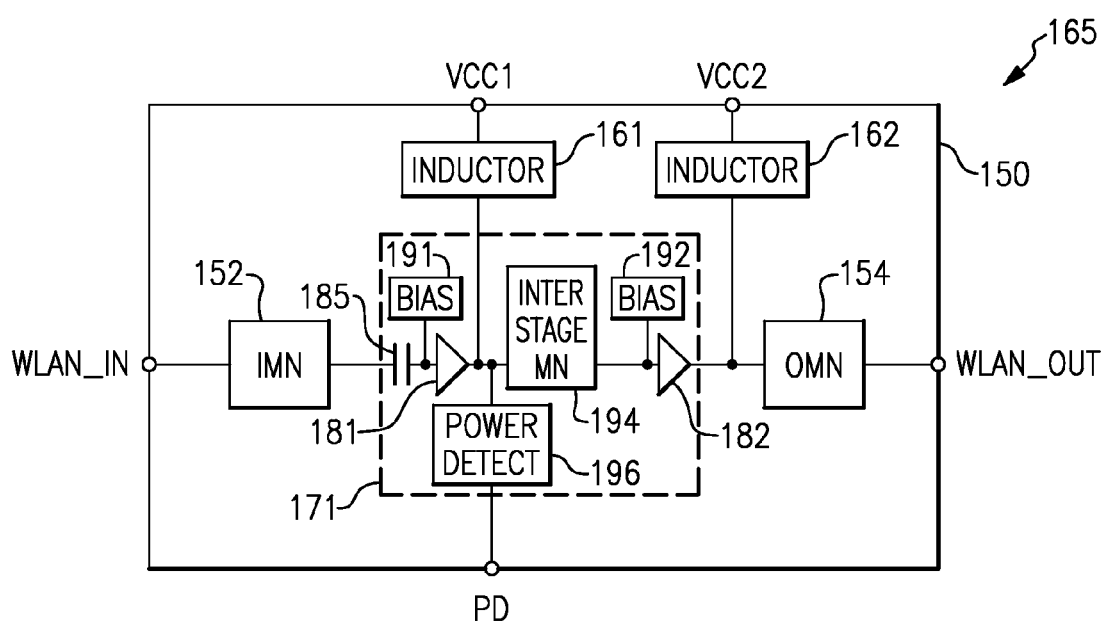
FIG. 12B is a schematic diagram of a WLAN power amplifier module according to another embodiment.

FIG. 12B is a schematic diagram of a WLAN power amplifier module 165 according to another embodiment. The WLAN power amplifier module 165 of FIG. 12B is similar to the WLAN power amplifier module 145 of FIG. 12A, except that the WLAN power amplifier module 165 of FIG. 12B includes a specific implementation of a WLAN power amplifier die 171.

As shown in FIG. 12B, the WLAN power amplifier die 171 includes an input stage 181, an output stage 182, a DC blocking capacitor 185, an input stage bias circuit 191, an output stage bias circuit 192, an inter-stage impedance matching network 194, and a power detector 196.

The DC blocking capacitor 185 is electrically connected between an input of the input stage 181 and the input impedance matching network 152, and can aid the input stage bias circuit 191 in biasing the input stage 181. The input stage 181 further includes an output, which is electrically connected to an input of output stage 182 through the inter-stage impedance matching network 194. The output of the input stage 181 is further connected to the power detector 196 and to the first power high supply pin VCC1 through the first inductor 161. The output stage 182 further includes an output that is electrically connected to the WLAN output pin WLAN_OUT through the output impedance matching network 154. The output of the output stage 182 is further connected to the second power high supply pin VCC2 through the second inductor 162.

The input stage bias circuit 191 can be used to bias the input stage 181, and the output stage bias circuit 192 can be used to bias the output stage 182. In certain implementations, the input stage bias circuit 191 and/or the output stage bias circuit 192 can be used to generate a bias current that has a magnitude that changes in relation to a power level of the amplified WLAN signal that is provided to the WLAN output pin WLAN_OUT. For example, with reference back to FIG. 9, a magnitude of a bias current generated by the input stage bias circuit 191 and/or a magnitude of a bias current generated by the output stage bias circuit 192 can be decreased when a power level of the amplified WLAN signal decreases.

In certain configurations, the input stage 181 and the output stage 182 are implemented using heterojunction bipolar transistors (HBTs). For example, the input stage 181 can include a first HBT having a base electrically connected to the input of the input stage 181, an emitter electrically connected to a ground supply, and a collector electrically connected to the output of the input stage 181. Additionally, the output stage 182 can include a second HBT having a base electrically connected to the input of the output stage 182, an emitter electrically connected to the ground supply, and a collector electrically connected to the output of the output stage 182.

In the illustrated configuration, the power detector 196 generates a power detection signal based on measuring an output power of the input stage 181, rather than by measuring an output power of the output stage 182. Configuring the power detector 196 in this manner can reduce size and/or enhance performance. For example, measuring an output power of the input stage 181 can avoid a need for a directional coupler at the output of the output stage 182. Such a directional coupler can increase size and cost and/or lead to signal loss. The illustrated power detector 196 is advantageously integrated on-chip with the WLAN power amplifier, and provides closed-loop power control when the WLAN power amplifier module 165 is connected to a WLAN transceiver on a phone board.

APPLICATIONS

Some of the embodiments described above have provided examples in connection with mobile phones. However, the principles and advantages of the embodiments can be used for any other systems or apparatus that have needs for power amplifier systems.

Such power amplifier systems can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions, and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A wireless local area network power amplifier system comprising:
   a wireless local area network power amplifier including an input and an output, the input configured to receive a wireless local area network signal having a fundamental frequency and the output configured to provide an amplified wireless local area network signal;
   an output impedance matching network electrically connected to the output of the wireless local area network power amplifier and configured to provide a load line impedance between 10Ω and 35Ω at the fundamental frequency of the wireless local area network signal; and
   an envelope tracker configured to receive an envelope signal corresponding to an envelope of the wireless local area network signal, the envelope tracker configured to control a voltage level of a power supply of the wireless local area network power amplifier based on the envelope signal.

2. The wireless local area network power amplifier system of claim 1 wherein the output impedance matching network is configured such that the load line impedance is between 18Ω and 22Ω at the fundamental frequency of the wireless local area network signal.

3. The wireless local area network power amplifier system of claim 1 wherein the output impedance matching network includes a fundamental matching circuit and one or more harmonic termination circuits, the fundamental matching circuit and each of the of the one or more harmonic termination circuits including separate input terminals coupled to the output of the wireless local area network power amplifier, the fundamental matching circuit and each of the one or more harmonic termination circuits separately tuned.

4. The wireless local area network power amplifier system of claim 3 wherein the one or more harmonic termination circuits includes a second harmonic termination circuit and a third harmonic termination circuit.

5. The wireless local area network power amplifier system of claim 1 further comprising a choke inductor electrically connected between the output of the wireless local area network power amplifier and an output of the envelope tracker that controls the voltage level of the power supply of the wireless local area network power amplifier.

6. The wireless local area network power amplifier system of claim 1 further comprising a bias circuit configured to generate a bias current for the wireless local area network power amplifier, the bias circuit configured to decrease a magnitude of the bias current in connection with a power level of the amplified wireless local area network signal decreasing.

7. The wireless local area network power amplifier system of claim 1 wherein the wireless local area network power amplifier includes an input stage and an output stage arranged in a cascade, the wireless local area network power amplifier system further comprising a power detector electrically connected to an output of the input stage.

8. A wireless device comprising:
   a transceiver configured to generate a wireless local area network signal and an envelope signal corresponding to an envelope of the wireless local area network signal;
   a wireless local area network power amplifier including an input and an output, the input configured to receive the wireless local area network signal and the output configured to generate an amplified wireless local area network signal;
   an output impedance matching network electrically connected to the output of the wireless local area network power amplifier and configured to provide a load line impedance between 10Ω and 35Ω at a fundamental frequency of the wireless local area network signal; and
   an envelope tracker configured to receive the envelope signal and to control a voltage level of a power supply of the wireless local area network power amplifier based on the envelope signal.

9. The wireless device of claim 8 wherein the output impedance matching network is configured such that the load line impedance is between 18Ω and 22Ω at the fundamental frequency of the wireless local area network signal.

10. The wireless device of claim 8 wherein the output impedance matching network includes a fundamental matching circuit and one or more harmonic termination circuits, the fundamental matching circuit and each of the of the one or more harmonic termination circuits including separate input terminals coupled to the output of the wireless local area network power amplifier, the fundamental matching circuit and each of the one or more harmonic termination circuits separately tuned.

11. The wireless device of claim 10 wherein the one or more harmonic termination circuits includes a second harmonic termination circuit and a third harmonic termination circuit.

12. The wireless device of claim 8 further comprising a choke inductor electrically connected between the output of the wireless local area network power amplifier and an output of the envelope tracker that controls the voltage level of the power supply of the wireless local area network power amplifier.

13. The wireless device of claim 8 further comprising a bias circuit configured to generate a bias current for the wireless local area network power amplifier, the bias circuit configured to decrease a magnitude of the bias current in connection with a power level of the amplified wireless local area network signal decreasing.

14. The wireless device of claim 8 wherein the transceiver includes an envelope shaping circuit configured to receive an amplitude signal and to generate a digital shaped signal, and a digital-to-analog converter configured to receive the digital shaped signal and to generate the envelope signal.

15. The wireless device of claim 8 wherein the wireless local area network power amplifier includes an input stage and an output stage arranged in a cascade, the wireless local area network power amplifier system further comprising a power detector electrically connected to an output of the input stage.

16. The wireless device of claim 15 wherein the transceiver includes a wireless local area network processor and an analog-to-digital converter, the analog-to-digital converter configured to receive an analog power detection signal from the power detector and to provide a digital power detection signal to the wireless local area network processor.

17. A method of wireless local area network signal amplification, the method comprising:

generating a wireless local area network signal and an envelope signal, the envelope signal corresponding to an envelope of the wireless local area network signal;

amplifying the wireless local area network signal using a wireless local area network power amplifier, the wireless local area network power amplifier including an input that receives the wireless local area network signal and an output that generates an amplified wireless local area network signal;

providing impedance matching to the output of the wireless local area network power amplifier using an output impedance matching network, the output impedance matching network providing a load line impedance between 10Ω and 35Ω at a fundamental frequency of the wireless local area network signal;

generating a power supply voltage for the wireless local area network power amplifier using an envelope tracker; and controlling a voltage level of the power supply voltage based on the envelope signal.

18. The method of claim 17 further comprising generating a bias current for the wireless local area network power amplifier using a bias circuit, and controlling a magnitude of the bias current based on a power level of the amplified wireless local area network signal.

19. The method of claim 17 wherein the wireless local area network power amplifier includes an input stage and an output stage arranged in a cascade, the method further comprising measuring an output power of the input stage using a power detector.

20. The method of claim 17 wherein the load line impedance is between 18Ω and 22Ω at the fundamental frequency of the wireless local area network signal.

* * * * *

UNITED STATES PATENT AND TRADEMARK OFFICE
CERTIFICATE OF CORRECTION

PATENT NO. : 9,876,478 B2
APPLICATION NO. : 14/493928
DATED : January 23, 2018
INVENTOR(S) : Hardik Bhupendra Modi et al.

Page 1 of 1

It is certified that error appears in the above-identified patent and that said Letters Patent is hereby corrected as shown below:

On the Title Page

Item [54] and in the Specification, Column 1 Line 1, change "WIDE" to --WIRELESS--.

In the Specification

Column 2 Line 11, change "of the of the" to --of the--.

Column 2 Line 58, change "of the of the" to --of the--.

In the Claims

Column 21 Line 39, Claim 3, change "of the of the" to --of the--.

Column 22 Lines 27-28, in Claim 10, change "of the of the" to --of the--.

Signed and Sealed this
Tenth Day of July, 2018

Andrei Iancu
*Director of the United States Patent and Trademark Office*